United States Patent
Koike et al.

(10) Patent No.: US 8,882,411 B2
(45) Date of Patent: Nov. 11, 2014

(54) DRILL AND METHOD OF CUTTING WORKPIECE USING THE SAME

(75) Inventors: Yoshifumi Koike, Higashiomi (JP); Hiroshi Ogawa, Higashiomi (JP)

(73) Assignee: Kyocera Corporation, Kyoto (JP)

( * ) Notice: Subject to any disclaimer, the term of this patent is extended or adjusted under 35 U.S.C. 154(b) by 416 days.

(21) Appl. No.: 13/260,895

(22) PCT Filed: Mar. 26, 2010

(86) PCT No.: PCT/JP2010/055368
§ 371 (c)(1),
(2), (4) Date: Sep. 28, 2011

(87) PCT Pub. No.: WO2010/125881
PCT Pub. Date: Nov. 4, 2010

(65) Prior Publication Data
US 2012/0039680 A1    Feb. 16, 2012

(30) Foreign Application Priority Data

Apr. 27, 2009  (JP) .................................. 2009-107911
May 28, 2009  (JP) .................................. 2009-129332

(51) Int. Cl.
*B23B 51/02*    (2006.01)
*H05K 3/00*    (2006.01)

(52) U.S. Cl.
CPC .............. *B23B 51/02* (2013.01); *H05K 3/0047* (2013.01); *B23B 2251/043* (2013.01); *B23B 2251/245* (2013.01); *B23B 2251/046* (2013.01)
USPC .......................................... 408/227; 408/230

(58) Field of Classification Search
CPC .. B23B 51/00; B23B 51/02; B23B 2251/043; B23B 2251/046; B23B 2251/12; B23B 2251/241; B23B 2251/245; B23B 2251/242; B23B 2251/282; B23B 2251/406; B23B 2251/408

USPC .......................................... 408/227, 229, 230
See application file for complete search history.

(56) References Cited

U.S. PATENT DOCUMENTS 472,541 A * 4/1892 Johnson ....................... 408/230
542,223 A * 7/1895 Johnson ....................... 408/230
(Continued)

FOREIGN PATENT DOCUMENTS

DE  102007062539 A1 * 6/2008
JP  03-245908         11/1991
(Continued)

OTHER PUBLICATIONS

English translation of DE 102007062539.*

*Primary Examiner* — Andrea Wellington
*Assistant Examiner* — Alan Snyder
(74) *Attorney, Agent, or Firm* — Volpe and Koenig, P.C.

(57) ABSTRACT

A drill of the present invention includes a first cutting edge and a second cutting edge each located at a front end of a cylindrical cutting part; a first flute and a second flute connected to the first cutting edge and the second cutting edge, respectively, in which the first and second flutes are positioned helically from a front end to a rear end on a peripheral section of the cutting part; and a first land and a second land each extended from the front end to the rear end on the peripheral section of the cutting part, in which the first and second lands are being located portions between the first flute and the second flute, respectively. The first flute and the second flute are separately extended from the front end to the rear end. The cutting part includes a first region in which a diameter of an inscribed circle in a cross section perpendicular to a rotation axis of the cutting part increases in a direction away from the front end and toward the rear end. A method of cutting a workpiece using the drill is also provided.

18 Claims, 9 Drawing Sheets

(56) References Cited

U.S. PATENT DOCUMENTS

| | | | |
|---|---|---|---|
| 5,888,036 A * | 3/1999 | Arai et al. | 408/230 |
| 5,897,274 A * | 4/1999 | Ogura et al. | 408/230 |
| 6,200,074 B1 * | 3/2001 | Miller et al. | 408/1 R |
| 6,250,857 B1 * | 6/2001 | Kersten | 408/230 |
| 7,306,411 B2 * | 12/2007 | Mabuchi et al. | 408/230 |
| 2003/0185640 A1 * | 10/2003 | Ito | 408/230 |
| 2008/0058230 A1 | 3/2008 | Yoshikawa et al. | |

FOREIGN PATENT DOCUMENTS

| | | |
|---|---|---|
| JP | 08-127004 | 5/1996 |
| JP | 64-078711 | 3/1999 |
| JP | 2002-144122 | 5/2002 |
| JP | 2007-307642 | 11/2007 |
| JP | 2008-55644 A | 3/2008 |

* cited by examiner (a)

(b)

(c)

(a)

(b)

(a)

(b)

(a)

(b)

DRILL AND METHOD OF CUTTING WORKPIECE USING THE SAME

TECHNICAL FIELD

The present invention relates to a drill, and a method of cutting a workpiece using the drill.

BACKGROUND ART

As a drill having a plurality of cutting edges, a two-blade drill including two cutting edges and two helical flutes connected to each of the cutting edges has conventionally been known. These two flutes of the two-blade drill are extended to the peripheral section of the drill in the same shape and at a certain helix angle. However, each flute contributes to a decrease in the cross-sectional area of the drill. Hence, the rigidity of the drill may be lowered when a plurality of such flutes are formed.

In contrast, for example, Japanese Unexamined Patent Publication No. 2007-307642 discloses that in the drill having, on the front end of the body thereof, two cutting edges and two helical flutes respectively connected to these two cutting edges, these two helical flutes are joined together into a single flute at a position retreated by a predetermined amount from the front end of the body.

However, in the drill having these two flutes thus joined together, the chips generated from each of the cutting edges tend to clog at the junction of the flutes. As a result, the clogged chips cause the generation of heat at the junction, and consequently there is a risk that the workpiece is deformed, or the inner wall of a drilled hole is deformed (surface roughness is deteriorated). There is also a risk that the chips clogged at the junction increases the stress exerted on the junction during drilling (cutting torque), thus causing the drill to fracture. On the other hand, these two flutes affect each other at the junction, thus causing changes in the flute shape. Consequently, there is a risk that the flow of chips passing through each of the flutes is changed, thus affecting the inner wall of the drilled hole.

Hence, there are a need for a drill having both high-quality hole drilling characteristics and sufficient rigidity, and a need for a method of cutting a workpiece using the drill.

SUMMARY OF THE INVENTION

A drill according to an embodiment of the present invention includes a first cutting edge and a second cutting edge located at a front end of a cylindrical cutting part; a first flute and a second flute connected to the first cutting edge and the second cutting edge, respectively, in which the first and second flutes are positioned helically from the front end to a rear end on a peripheral section of the cutting part; and a first land and a second land extended from the front end to the rear end on the peripheral section of the cutting part, in which the first and second lands are located independently between the first flute and the second flute. The first flute and the second flute are separately extended from the front end to the rear end. The cutting part includes a first region in which a diameter of an inscribed circle in a cross section perpendicular to a rotation axis of the cutting part increases in a direction away from the front end and toward the rear end.

A method of cutting a workpiece according to an embodiment of the present invention includes preparing a workpiece; rotating the drill; forming a through hole in the workpiece by bringing the first cutting edge and the second cutting edge of the rotating drill into contact with the workpiece; and allowing the workpiece and the drill to relatively separate from each other.

In the drill according to the embodiment of the present invention, the first flute and the second flute are separately extended from the front end to the rear end. In addition to this, the cutting part includes the first region in which the diameter of the inscribed circle in the cross section perpendicular to the rotation axis of the cutting part increases in the direction away from the front end and toward the rear end. These features allow the drill to have both high-quality hole drilling characteristics and sufficient rigidity. Specifically, owing to the feature that the first flute and the second flute are separately extended from the front end to the rear end, it is capable of reducing the aforementioned various kinds of problems caused by the fact that the chips discharged through each of the flutes are joined together. Additionally, owing to the feature that the cutting part includes the first region in which the diameter of the inscribed circle in the cross section perpendicular to the rotation axis of the drill increases in the direction away from the front end and toward the rear end, it is capable of ensuring higher rigidity while having these two flutes, than the aforementioned conventional two-blade drills.

BRIEF DESCRIPTION OF THE DRAWINGS

Furthermore, FIGS. 3(a), 3(c), 4(a), and 7(a) are the drawings showing the shape at a position (the front end portion in the first region) corresponding to FIG. 1(b). FIGS. 3(b), 4(b), and 7(b) are the drawings showing the shape at a position (the rear end portion in the first region) corresponding to FIG.

1(c). FIG. 6 is the drawing showing the shape at a position (the central part of the first region) corresponding to FIG. 5(b).

PREFERRED EMBODIMENTS FOR CARRYING OUT THE INVENTION

<Drill>

First Embodiment

Figure 1:
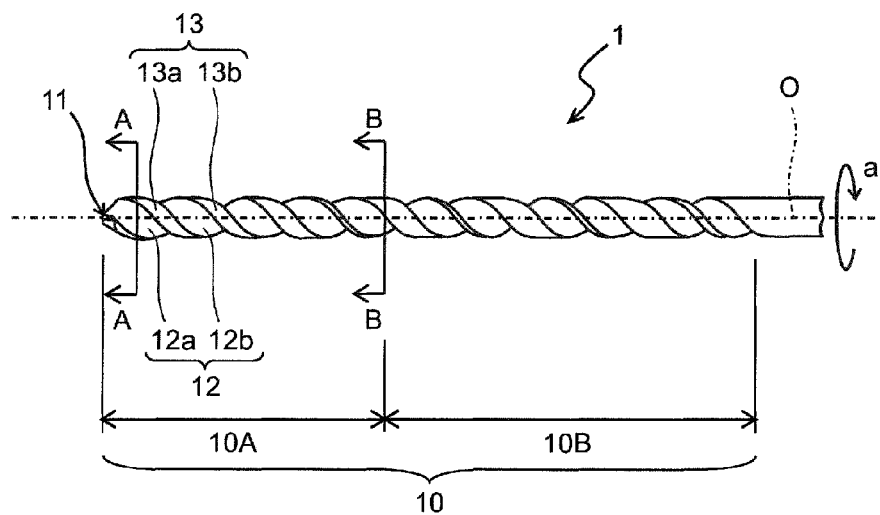
FIG. 1(a) is a side New showing the vicinity of a cutting part of a drill according to a first embodiment of the present invention.
FIG. 1(b) is an enlarged sectional view taken along the line A-A in FIG. 1(a)
FIG. 1(c) is an enlarged sectional view taken along the line B-B in FIG. 1(a)
Figure 1:
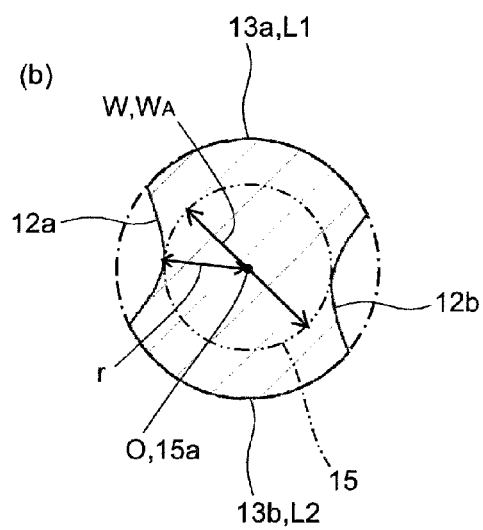
Figure 1:
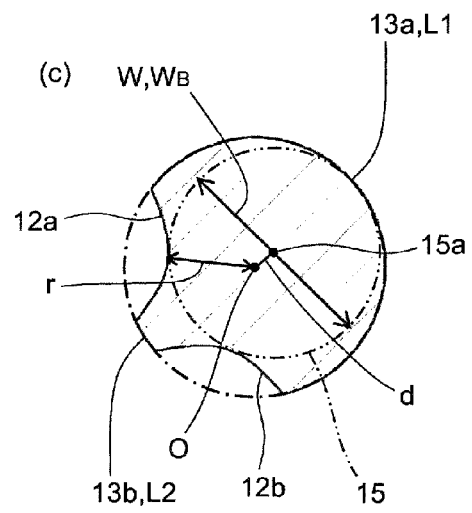

The first embodiment of the drill according to the present invention is described in detail below with reference to FIGS. 1 and 2. As shown in FIG. 1(a), the drill 1 of the present embodiment includes a shank part (not shown) gripped by a rotary shaft of a machine tool; and a cutting part 10 disposed on one end of the shank part. The shank part is the part designed according to the shape of the rotary shaft of the machine tool. The cutting part 10 is the part to be brought into contact with a workpiece.

Two cutting edges 11 (the first cutting edge 11a and the second cutting edge 11b) are formed at the front end of the cutting part 10. As shown in FIG. 2(b), the first cutting edge 11a and the second cutting edge 11b are formed to have 180° rotational symmetry around a rotation axis O (axis) of the cutting part 10. That is, the first cutting edge 11a and the second cutting edge 11b are dyad symmetry to each other with respect to the rotation axis O. This arrangement improves linear motion stability during drilling of the workpiece. A chisel edge 11c is located at the mostfront side of the cutting part 10, and has a function of cutting the workpiece together with the first cutting edge 11a and the second cutting edge 11b. The chips formed by the cutting edges 11 are discharged through the flutes 12 to the rear end side. The chips formed by the chisel edge 11c are discharged to the rear end side through a second flank face 14b of two flank faces 14 (the first flank face 14a and the second flank face 14b) and then through the flutes 12. The flank faces 14 have the function of reducing cutting resistance by avoiding contact with the workpiece. The arrow indicates the rotation direction of the drill.

As shown in FIG. 1(a), these two flutes 12 (helical flutes) corresponding to the individual cutting edges 11 are formed along the rotation axis O on the peripheral section (the peripheral surface) of the cutting part 10. These two flutes 12 (the first flute 12a and the second flute 12b) are formed to discharge the chips generated from the cutting edges 11. The first flute 12a and the second flute 12b are connected to the first cutting edge 11a and the second cutting edge 11b, respectively, and are positioned helically from the front end to the rear end (the shank part side) of the cutting part 10.

The rear end sides of these two flutes 12 in the direction of the central axis O are provided with their respective corresponding two lands 13 (the first land 13a and the second land 13b). The lands 13 are the section corresponding to the periphery of the drill 1. Therefore, the lands 13 are formed on a part of the peripheral section of the cutting part 10 in which the flutes 12 are not formed. The first land 13a is formed correspondingly to the first flute 12a, and the second land 13b is formed correspondingly to the second flute 12b. That is, the first land 13a and the second land 13b are extended from the front end to the rear end on the peripheral section of the cutting part 10, and are located independently between the first flute 12a and the second flute 12b. The first flute 12a and the second flute 12b can be formed independently from each other by ensuring the lands 13 over the entire length of the cutting part 10.

Furthermore, the cutting part 10 is the part to be brought into contact with the workpiece, and has the flutes 12 formed from the front end to the rear end on the peripheral section, as described above. As shown in FIGS. 1(b) and 1(c), in the cutting part 10, a radium r of a shaft center portion around the rotation axis O, namely, the shortest distance from the rotation axis O to the flutes 12 is constant from the front end to the rear end. Also in the cutting part 10. D1 and D2 have a relationship of D1=D2, where D1 is a diameter at the front end in a cross section perpendicular to the rotation axis O, and D2 is a diameter at a portion other than the front end. Further, in the cross section perpendicular to the rotation axis O, the diameter of the cutting part 10 is constant from the front end to the rear end. Therefore in the present embodiment, the cutting part 10 has a (substantially) cylindrical shape. The shape of the cutting part 10 may have a shape normally employed by those skilled in the art. For example, as described later, the cutting part may have such a tapered shape that the radius r of the shank center portion increases in the direction away from the front end to the rear end. Alternatively, the cutting part may be tilted so that the drill diameter (outer diameter) increases or decreases in the direction away from the front end and toward the rear end. Further, a later-described undercut portion may be disposed in the cutting part 10.

Hereat, the first flute 12a and the second flute 12b are independent from each other, and are separately extended from the front end to the rear end. That is, the first flute 12a and the second flute 12b do not contact with each other (join together) over the entire length of the cutting part 10. Accordingly, the chips generated by each of the cutting edges 11 and then discharged along the individual flutes 12 cannot be joined together. It is therefore capable of reducing the fact that a chip clogging portion is heated to deform the workpiece or deform the inner wall of the drilled hole (deteriorate surface roughness). It is also capable of reducing the fact that the increase of the stress exerted on the chip clogging portion causes the drill to fracture. On the other hand, there is no variation in the flute shape due to the joining together of chips, thereby reducing the fact that the inner wall of the drilled hole is affected by the change of the flow of chips passing through the individual flutes.

This effect is noticeable in the case of using, as a workpiece, a resin board having low heat resistance, or a composite board or the like using the resin board. Examples of the composite board include a printed circuit board. The printed circuit board is a member obtained by laminating a copper foil on a glass epoxy material having glass fiber impregnated with resin such as epoxy. Unless the chips are smoothly discharged during drilling of the printed circuit board, the chips of the copper foil affect the inner wall of the drilled hole, and the cutting heat is not released satisfactorily and is accumulated within the drilled hole. As a result, the resin is softened, and the roughness of the inner surface of the drilled hole is increased (the inner wall roughness is deteriorated). The drill of the present embodiment can also be used suitably with respect to the printed circuit board whose inner wall roughness is apt to increase.

The cutting part 10 includes a first region 10A in which a diameter W of an inscribed circle 15 in a cross section perpendicular to the rotation axis O of the cutting part increases in the direction away from the front end and toward the rear end. That is, in the first region 10A, $W_A$ and $W_B$ have a relationship of $W_A<W_B$, where $W_A$ is a diameter of the inscribed circle 15 located close to the front end, and $W_B$ is a diameter of the inscribed circle 15 located close to the rear end. Further, a distance d between the center 15a of the inscribed circle 15 and the rotation axis O increases in the direction away from the front end and toward the rear end. The center 15a in the vicinity of the front end is located at the same position as the rotation axis O.

Hereat, the inscribed circle 15 is the largest circle that can be formed in the cross section perpendicular to the central axis O. The diameter W of the inscribed circle 15 corresponds to the cross-sectional core thickness of the drill which becomes an index to measure the rigidity of the drill. Therefore, as the diameter W increases, the cross-sectional core thickness increases, thus showing that the drill has high rigidity. In the present embodiment, owing to the aforementioned relationship of $W_A<W_B$, a larger cross-sectional core thickness of the drill can be ensured toward the rear end, thereby enhancing the rigidity of the drill.

As discussed above, in the drill 1 of the present embodiment, the first flute 12a and the second flute 12b are separately extended from the front end to the rear end, and the cutting part 10 has the first region 10A in which the inscribed circle 15 in the cross section perpendicular to the rotation axis O of the cutting part increases in the direction away from the front end and toward the rear end, thus allowing the drill to have both high-quality hole drilling characteristics and sufficient rigidity.

The relationship of $W_A<W_B$ can be satisfied by various methods. For example, this can be achieved by changing the helix angle of the flutes, or changing the width, depth, or the like of the flutes. Alternatively, the relationship of $W_A<W_B$ may be satisfied by combining these methods.

In the first region 10A of the present embodiment, a ratio R (L1/L2) of the (circumferential) length L1 of the first land 13a and the (circumferential) length of the second land 13b increases in the direction away from the front end and toward the rear end. A larger cross-sectional core thickness of the drill can be ensured toward the rear end by including the first region where the ratio R (land width ratio) is increased.

Specifically, the first land 13a and the second land 13b are formed substantially symmetrically at the front end portion of the first region 10A (refer to FIG. 1(b)). This provides superior cutting balance, and also achieves an excellent drilled surface. On the other hand, at the rear end portion of the first region 10A, the length L1 of the first land 13a is markedly different from the length L2 of the second land 13b, and therefore the ratio R is larger than that of the front end portion (refer to FIG. 1(c)). This configuration ensures a larger cross-sectional core thickness of the drill, and also achieves higher rigidity than the case where the flutes are symmetrical when viewed in cross section. Hereat, the length L1 of the first land 13a and the length L2 of the second land 13b are both the peripheral length of each land in the cross section perpendicular to the rotation axis O.

Moreover, in the first region 10A of the present embodiment, the length L1 of the first land 13a increases in the direction away from the front end and toward the rear end, and the length L2 of the second land 13b decreases in the direction away from the front end and toward the rear end. In other words, in a side view, the width of the first land 13a in the direction of the rotation axis O increases in the direction away from the front end and toward the rear end, and the width of the second land 13b in the direction of the rotation axis O decreases in the direction away from the front end and toward the rear end.

It is preferred that the cutting part 10 be located at the rear end of the first region 10A, and the cutting part 10 further include a second region 10B where the ratio R is constant. By including the second region 10B thus configured, the helix angles of the first flute 12a and the second flute 12b, and the diameter W of the inscribed circle 15 can be maintained at their respective desired values, thus allowing the drill to have both high-quality hole drilling characteristics and sufficient rigidity. With regard to the fact that the ratio R is constant, the ratio R may be substantially constant. It is also preferred that the first region 10A and the second region 10B be continuous with each other. This allows chips to be discharged smoothly. In the second region 10B, the ratio R at the end portion on the front end is 1.5 or more, from the viewpoint of obtaining the sufficient rigidity. In the first region 10A, for example, the ratio R at the front end of the first region 10A is preferably 1. That is, the length L1 of the first land 13a and the length L2 of the second land 13b are preferably equal to each other.

No particular limitation is imposed on the ratio of the first region 10A and the second region 10B in the cutting part 10. For example, as the ratio of the second region 10B increases, the ratio of the area having a large cross-sectional core thickness in the cutting part 10 increases, thus improving rigidity. The ratio of the first region and the second region is preferably 1:1 or more, more preferably 1:1 to 1:4.

Alternatively, the cutting part 10 may include a third region (not shown) where the ratio R is constant on the front end of the first region 10A. The provision of the third region improves cutting balance and also improves the drilled surface of the workpiece. For example, the third region is preferably a region of approximately 2D along the direction of the rotation axis O from the front end of the cutting part 10, where D is an outer diameter of the cutting edge.

Furthermore, in the drill 1 of the present embodiment, there is an angle difference between the helix angles of the first flute 12a and the second flute 12b. The relationship of $W_A<W_B$ can also be satisfied by this method. The angle difference $\Delta\theta$ between the helix angles $\theta1$ and $\theta2$ is described in detail below.

The first flute 12a and the second flute 12b are twisted around each other at an angle (helix angle) $\theta$ made with the central axis O, toward the rear end in the direction of the central axis O. The lands 13 have a helix angle corresponding to the flutes 12. In the present embodiment, as shown in FIG. 2(a), the first flute 12a has the helix angle $\theta1$, and the second flute 12 has the helix angle $\theta2$.

No particular limitation is imposed on the dimension of the helix angles of these flutes 12, namely the helix angles $\theta1$ and $\theta2$. For example, they are set at 30° or more, preferably 30-60°, and more preferably 45-60°. By setting the helix angles at 30° or more, chip discharge performance can be improved, for example, when a small diameter hole is drilled in the printed circuit board, or when performing deep hole drilling. When the helical angles are 45° or more, more excellent drilled surface can be obtained. In the case of using the drill in which one of these two flutes has a helix angle of 45° and the other has a helix angle of 50°, the inner wall roughness of the obtained drilled surface is as excellent as 3-6 μm. On the other hand, in the case where one helix angle is 45° and the other is 30°, the inner wall roughness of the obtained drilled surface is approximately 3-9 μm. Especially in the aforementioned third region, it is preferred that the helix angle $\theta1$ and the helix angle $\theta2$ are each 30° or more.

The helix angles $\theta1$ and $\theta2$ may be constant over the entire length of the cutting part 10 (from the front end to the rear end), or may be partially changed. In the first region 10A of the present embodiment, the helix angle $\theta1$ of the first flute 12a is set in the range of 40-45°, and the helix angle $\theta2$ of the second flute 12b is set in the range of 40-60°.

Hereat, in the present embodiment, the helix angle $\theta1$ and the helix angle $\theta2$ are formed to create the angle difference $\Delta\theta$ at the front end portion of the first region 10A. For example, it is preferred to set to create the angle difference Δθ of at least 10°. Furthermore, it is preferred to form so that the angle difference Δθ between the helix angle θ1 and the helix angle θ2 be maximized in the vicinity of the front end portion. For example, the maximum angle difference is 1° or more, preferably 3° or more, more preferably 10° or more, still more preferably 15° or more, and most preferably 15-20°. In the present embodiment, the maximum angle difference lies in the vicinity of the front end portion, and the angle difference Δθ thereof is approximately 15°. Further in the present embodiment, the angle difference Δθ between the helix angle θ1 and the helix angle θ2 increases toward the rear end in the vicinity of the front end portion in the first region 10A.

Subsequently, in the part of the first region 10A which is extended from the vicinity of the front end to the rear end, the angle difference Δθ between the helix angle θ1 of the first flute 12a and the helix angle θ2 of the second flute 12b decreases toward the rear end. This allows the formation of the first region 10A in which the diameter W of the inscribed circle 15 and the ratio R increase toward the rear end. No particular limitation is imposed on the method for decreasing the angle difference between the helix angle θ1 and the helix angle θ2. For example, one helix angle (the helix angle θ1) may be constant, and the other helix angle (the helix angle θ2) may be decreased. Alternatively, both helical angles (the helix angle θ1 and the helix angle θ2) may be individually changed. Additionally, a portion where the angle difference between the helical angles is partially constant may be included in the vicinity of the front end or at a certain location between the front end and the rear end.

In the second region 10B, the helix angle θ1 of the first flute 12a and the helix angle θ2 of the second flute 12b are preferably the same, namely, the angle difference between the helix angle θ1 and the helix angle θ2 is preferably 0°. This allows the formation of the second region 10B where the diameter W of the inscribed circle 15 and the ratio R are constant. In this case, it is preferred that the helix angle θ1 and the helix angle θ2 be respectively set in the range of 30-60°. For example, in the present embodiment, approximately half of the entire length of the cutting part 10 corresponds to the second region 10B where the angle difference Δθ is 0°. In this case, the helix angle θ1 and the helix angle θ2 are both 45°.

Second Embodiment

No particular limitation is imposed on the flute shape insofar as used in normal drills. The first and second flutes may be of identical shape or different shapes. For example, the first flute and the second flute differ from each other in the flute width (the circumferential length) or the flute depth (the distance from the peripheral part in the direction of the rotation axis O). Specific examples thereof are described below.

Figure 3:
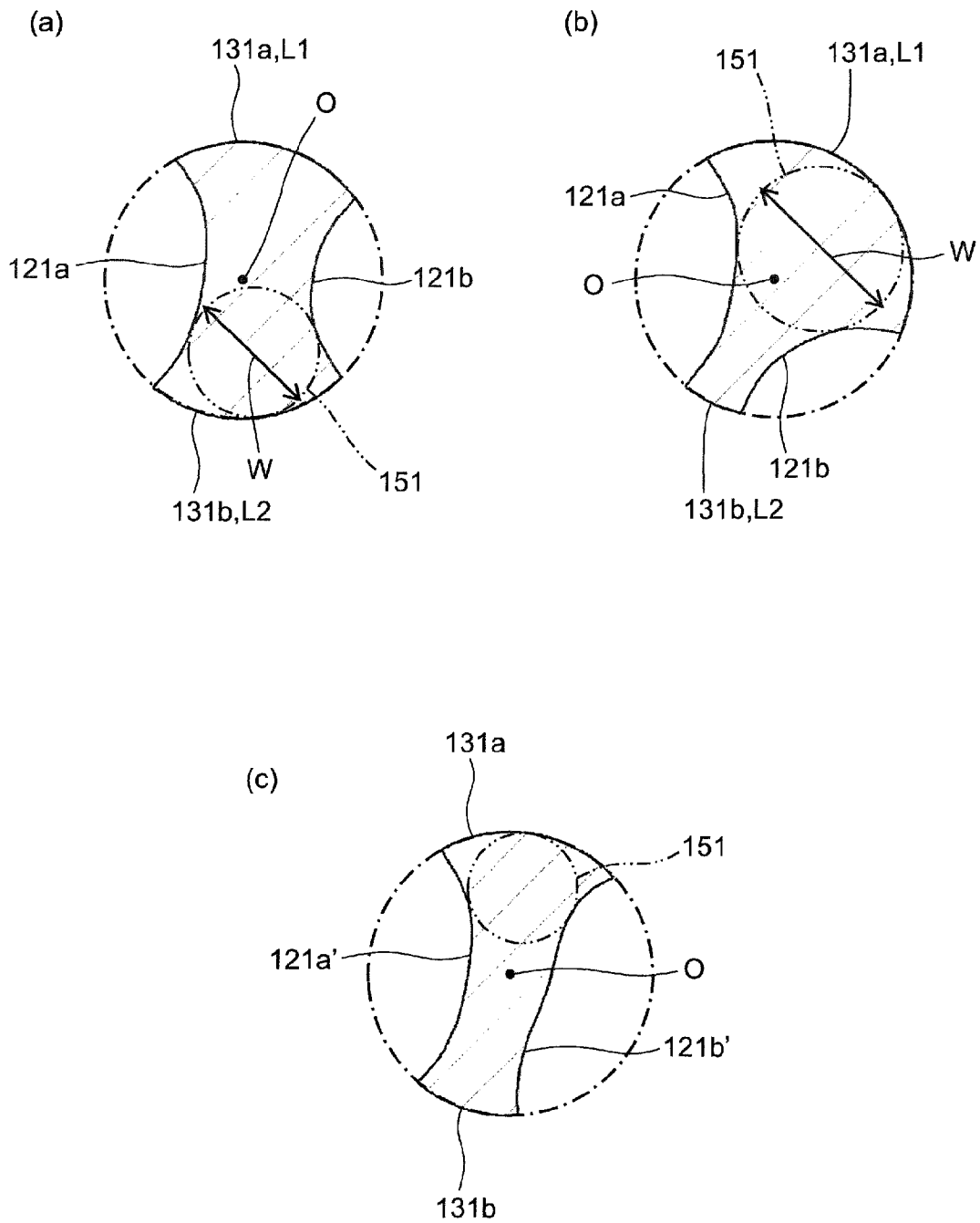
FIG. 3(a) is an enlarged sectional view showing a front end portion of a first region in a drill according to a second embodiment of the present invention.
FIG. 3(b) is an enlarged sectional view showing a rear end portion of the first region.
FIG. 3(c) is an enlarged sectional view showing other example of FIG. 3(a)

In the present embodiment, as shown in FIGS. 3(a) and 3(b), a first flute 121a and a second flute 121b differ from each other in dimension (depth). Also in the present embodiment, a helix angle θ1 of the first flute 121a and a helix angle θ2 of the second flute 121b decreases in the direction away from the front end and toward the rear end in the first region. Thereby, a ratio R (L1/L2) of a length L1 of a first land 131a and a length L2 of a second land 131b in the first region increases in the direction away from the front end and toward the rear end, and the diameter W of the inscribed circle 151 increases in the direction away from the front end and toward the rear end. The first and second flutes are separately extended from the front end to the rear end. Therefore, even though the two flutes are different from each other in the flute size, it is capable of allowing the drill to have both high-quality hole drilling characteristics and sufficient rigidity. In the second region, the ratio R as shown in FIG. 3(b) is retained from the front end to the rear end.

Furthermore, the flutes may be of different shapes like a first flute 121a' and a second flute 121b' as shown in FIG. 3(c).

Other configurations are similar to those of the drill 1 of the foregoing first embodiment, and hence the description thereof is omitted.

Third Embodiment

Figure 4:
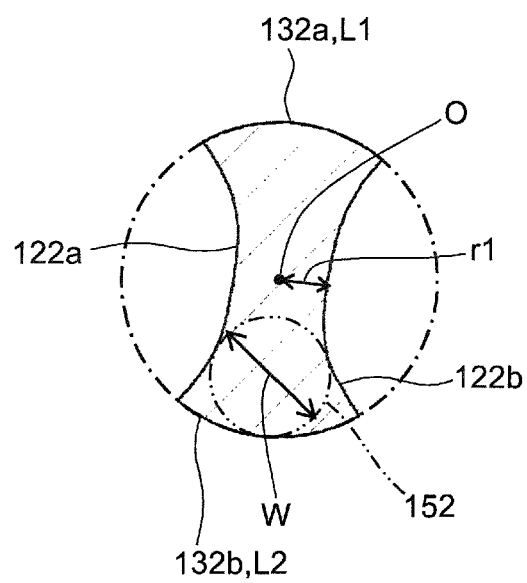
FIG. 4(a) is an enlarged sectional view showing a front end portion of a first region in a drill according to a third embodiment of the present invention.
FIG. 4(b) is an enlarged sectional view showing a rear end portion of the first region.
Figure 4:
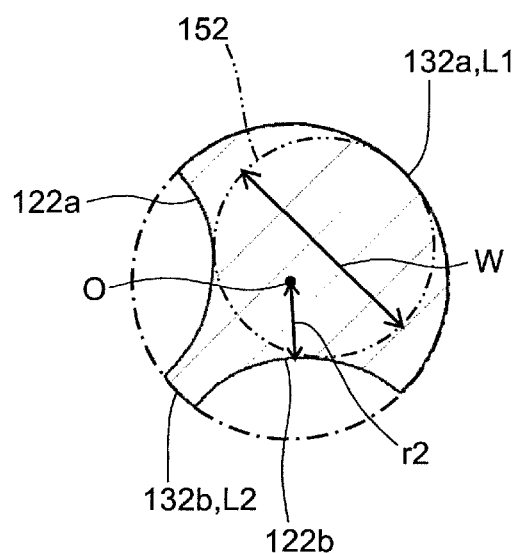

The drill of the present embodiment is a tapered drill in which a radius r of a shaft core portion of a cutting part increases in the direction away from the front end and toward the rear end. That is, as shown in FIGS. 4(a) and 4(b), in the cutting part of the present embodiment, a radius r1 of the shaft core portion located closer to the front end, and a radius r2 of the shaft core portion located closer to the rear end have a relationship of r1<r2. In other words, in the drill 1 of the present embodiment, a first flute 122a and a second flute 122b have the same shape, and a diameter W of an inscribed circle 152 increases in the direction away from the front end and toward the rear end by decreasing the depth of the first flute 122a and the depth of the second flute 122b in the direction away from the front end and toward the rear end. Thus, even though the shaft core portion of the cutting part of the drill is tapered, the cross-sectional core thickness can be increased, thereby enhancing rigidity.

Similarly to the drill 1 of the foregoing first embodiment, the difference between the helix angle θ1 of the first flute 122a and the helix angle θ2 of the second flute 122b decreases in the direction away from the front end and toward the rear end in the first region. Thereby, in the first region, a ratio R (L1/L2) of a length L1 of a first land 132a and a length L2 of a second land 132b increases in the direction away from the front end and toward the rear end. Owing to this feature coupled with the aforementioned tapered shape, the diameter W of the inscribed circle 152 can be further increased in the direction away from the front end and toward the rear end. In the second region, the ratio R as shown in FIG. 4(b) is retained from the front end to the rear end.

Other configurations are similar to those of the drill 1 of the foregoing first embodiment, and hence the description thereof is omitted.

Fourth Embodiment

Figure 5:
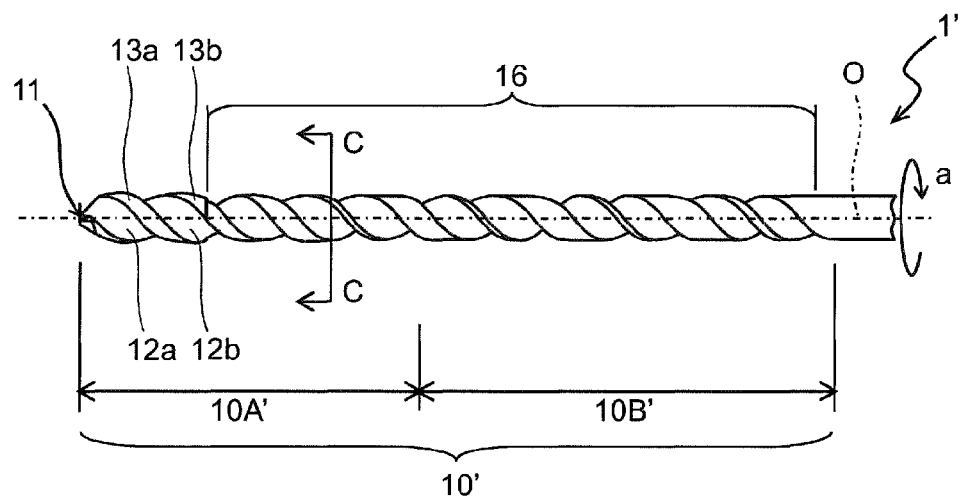
FIG. 5(a) is a side view showing the vicinity of a cutting part of a drill according to a fourth embodiment of the present invention.
FIG. 5(b) is an enlarged sectional view taken along the line C-C in FIG. 5(a)
Figure 5:
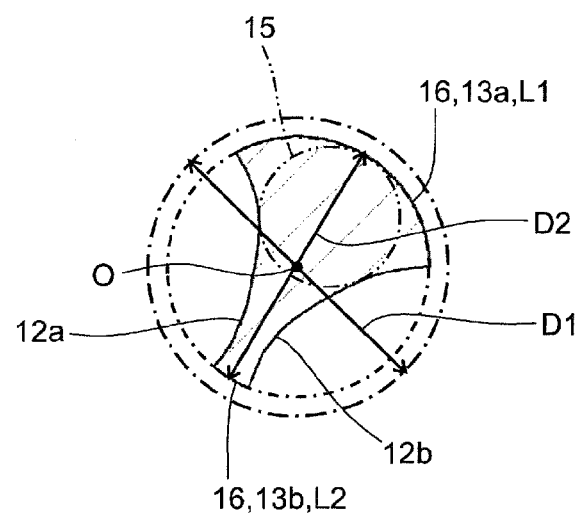

In the drill of the present embodiment, lands are partially provided with notch portions (undercut portions). That is, as shown in FIGS. 5(a) and 5(b), in a cutting part 10' in the drill 1' of the present embodiment, D1 and D2 have a relationship of D1>D2, where D1 is a diameter at the front end in a cross section perpendicular to the rotation axis O, and D2 is a diameter at a portion other than the front end. That is, an undercut part 16 is formed from a substantially mid-portion of a first region 10A' to a second region 10B'. The drill 1' including the undercut part 16 exhibits high chip discharge performance. Additionally, the effect of reducing contact between the drill 1' and the inner wall of a drilled hole can also be expected. In the present embodiment, the undercut part 16 is formed so that the drill diameter (outer diameter) is in the shape of stairs at the substantially mid-portion of the first region 10A in a side view. In another alternative, the drill diameter (outer diameter) may gradually decrease in the vicinity of the substantially mid-portion of the first region 10A'.

The drill 1', though including the undercut part 16, includes the cutting part 10' having a similar configuration to that of the foregoing cutting part 10, and therefore has superior rigidity to that of the conventional two-blade drill including a similar undercut portion. In this configuration, a length L1 of a first land 13a and a length L2 of a second land 13b are measured by a circumferential length including the undercut part 16. That is, the length of each land may be specified by a circumferential length in the drill diameter (outer diameter) reduced by undercutting.

Other configurations are similar to those of the drill 1 of the foregoing first embodiment, and hence the description thereof is omitted.

Fifth Embodiment

Figure 6:
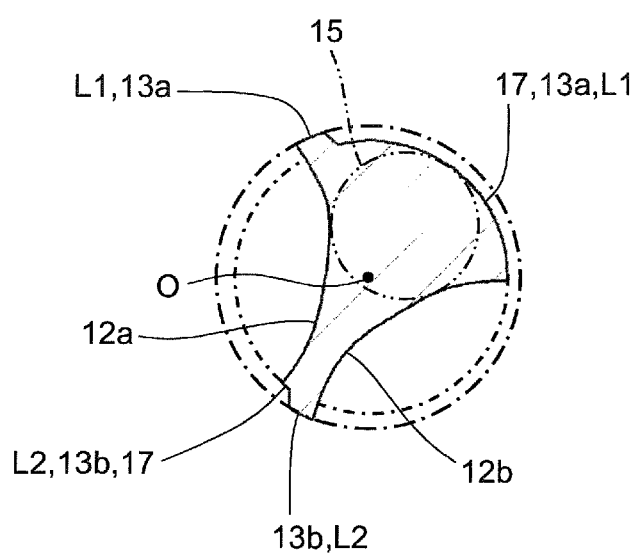
FIG. 6 is an enlarged sectional view showing a first region in a drill according to a fifth embodiment of the present invention.

The drill of the present embodiment has a clearance part 17 at a portion in a front end region of the drill, except for a cutting edge 11. As shown in FIG. 6, the clearance part 17 is continuously formed from the front end region to a rear end region. The region where the clearance part 17 is not formed corresponds to a margin part, and the drill diameter (outer diameter) is maintained by a dimension before forming the clearance part 17. In this configuration, a length L1 of a first land 13a and a length L2 of a second land 13b are measured by a circumferential length including the clearance part 17. That is, the first land 13a includes the clearance part 17 and the margin part. Therefore, the length L1 of the first land 13a is a sum of the length of the land in the clearance part 17 and the length of the land in the margin part. The length L2 of the second land 13b is similarly measured.

The drill with the clearance part 17 thus formed is capable of exhibiting high chip discharge performance. The effect of reducing contact between the drill and the inner wall of a drilled hole can also be expected.

Other configurations are similar to those of the drill 1 of the foregoing first embodiment, and hence the description thereof is omitted.

Sixth Embodiment

Figure 7:
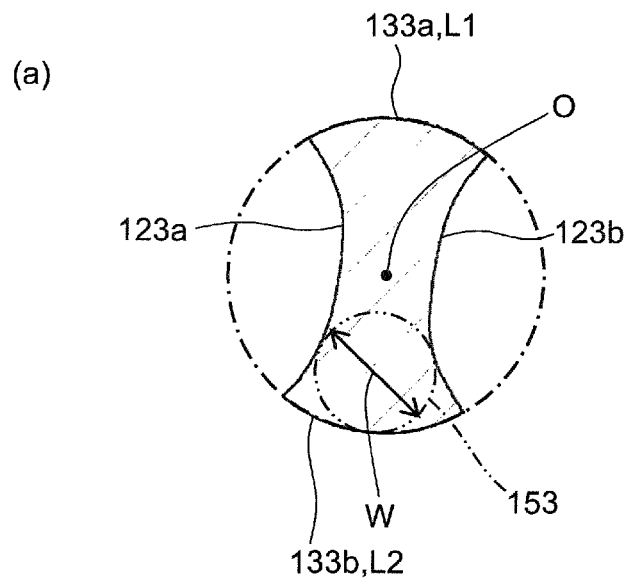
FIG. 7(a) is an enlarged sectional view showing a front end portion of a first region in a drill according to a sixth embodiment of the present invention.
FIG. 7(b) is an enlarged sectional view showing a rear end portion of the first region.
Figure 7:
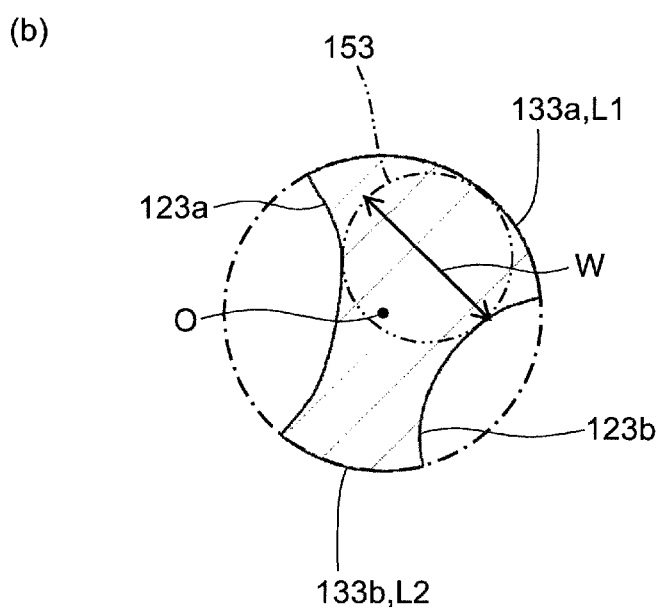

In the present embodiment, a first flute 123a and a second flute 123b differ from each other in size (depth), and the shape of the second flute 123b is changed from the front end to the rear end of a first region. Consequently, the first flute 123a and the second flute 123b have the same shape in the front end portion of a first region 10A, as shown in FIG. 7(a). The depth (size) of the second flute 123b is smaller than the depth (size) of the first flute 123a in the rear end portion of the first region 10A, as shown in FIG. 7(b). The position of the second flute 123b with respect to the first flute 123a is also relatively changed, so that a ratio R (L1/L2) of a length L of a first land 133a and a length L2 of a second land 133b increases in the direction away from the front end and toward the rear end. With this configuration, a diameter W of an inscribed circle 153 increases in the direction away from the front end and toward the rear end. Thus, the ratio R and the diameter W can also be changed by changing the shape of one flute. In the section region, the ratio R as shown in FIG. 7(b) is retained from the front end to the rear end.

Other configurations are similar to those of the drill 1 of the foregoing first embodiment, and hence the description thereof is omitted.

The drill of each of the foregoing embodiments is used by inserting a shank part formed on the rear end of the cutting part into a drill holding part of a machine tool. No particular limitation is imposed on the machine tool insofar as usually used by those skilled in the art. For example, various kinds of machines, such as machining centers, are used.

The drill attached to the machine tool is firstly rotated around the rotation axis O in the direction of the arrow a. Next, the rotating drill is moved to the front end side in the rotation axis O, and is then pressed against, for example, a workpiece. Thus, a drilled hole having a predetermined inner diameter can be formed in the workpiece.

The drills of the present invention are suitably used as a small diameter drill whose cutting edge has an outer diameter of 0.6 mm or less, preferably 0.3 mm or less, or a drill for deep hole drilling. These drills are particularly suitable for hole drilling of workpieces susceptible to thermal damage. The drills of the present invention are suitably used for deep hole drilling in which, for example, L/D is 5 or more, where L is an axial length (the length from the cutting edge to the termination of the flute parts), and D is a diameter (the outer diameter of the cutting edge).

Figure 8:
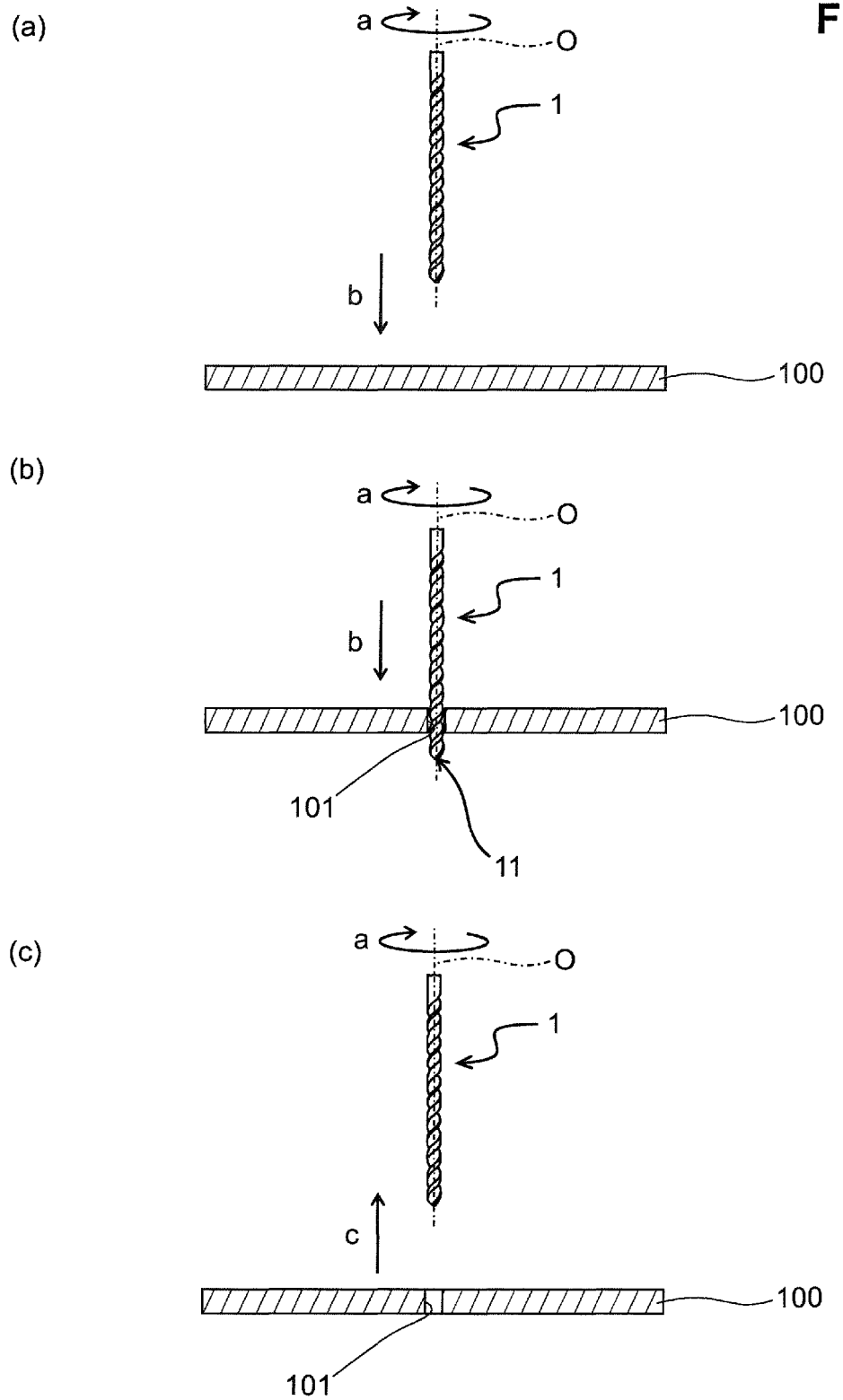
FIGS. 8(a) to 8(c) are process drawings showing a method of cutting a workpiece according to an embodiment of the present invention.

An embodiment of the method of cutting a workpiece according to the present invention is described in detail below with reference to FIG. 8, by illustrating the case of using the drill 1 according to the foregoing first embodiment. The method of cutting the workpiece according to the present embodiment includes the following steps (i) to (iv).

(i) As shown in FIG. 8(a), a workpiece 100 is firstly prepared, and the drill 1 is positioned above the workpiece 100.

(ii) Subsequently, the drill 1 is brought near the workpiece 100 by rotating the drill 1 in the direction of the arrow a around the rotation axis O, and by moving it in the direction of the arrow b.

(iii) As shown in FIG. 8(b), a through hole 101 is formed in the workpiece 100 by further moving the drill 1 in the direction of the arrow b, and by bringing the first cutting edge 11a and the second cutting edge 11b of the rotating drill 1 into contact with a desired position on the surface of the workpiece 100.

(iv) As shown in FIG. 8(c), the drill 1 is separated from the workpiece 100 by moving the drill 1 in the direction of the arrow c.

Hereat, the drill 1 has the sufficient rigidity for the aforementioned reason, and hence is unsusceptible to fracture. It is therefore capable of stably cutting the workpiece 100 over a long period of time. Even when the workpiece 100 has low heat resistance, the high-quality drilled hole is obtainable for the aforementioned reason.

As the workpiece 100 having low heat resistance, there are the foregoing printed circuit board and the like. Therefore, the step (i) of preparing the workpiece 100 preferably includes laminating a plurality of boards with a conductor composed of copper and the like pattern-formed on their respective surfaces, while interposing between the boards an intermediate layer containing a resin material; and softening the resin material by heating the intermediate layer. The intermediate layer is preferably one which is obtained by impregnating the resin material into a glass cloth, from the viewpoint of reinforcing the boards as the workpiece, and also retaining insulation between the boards. By pressing under temperature conditions of, for example, 200° C. or above, the resin material of the intermediate layer is softened, and the boards having surface irregularities are laminated one upon another without any clearance therebetween, thereby forming the workpiece 100.

When the workpiece 100 contains glass, powder glass that is part of chips has viscosity or is melted by the generation of heat due to chip clogging or the like. Hence, there is a tendency to further deteriorate chip discharge performance. However, the drill 1 of the present embodiment is capable of exhibiting excellent chip discharge performance even when the workpiece 100 contains the glass.

For the purpose of achieving excellent machined surface, in the step (iii) of forming the through hole 101, it is preferred that a partial region close to the rear end in the cutting part 10 of the drill 1 be not passed through the workpiece 100. That is, the excellent chip discharge performance can be achieved by allowing the partial region to function as a margin region for discharging chips.

The step (ii) is carried out by, for example, fixing the workpiece 100 on the table of the machine tool with the drill 1 attached thereto, and by bringing the rotating drill 1 near the workpiece. In the step (ii), the workpiece 100 and the drill 1 may be relatively close to each other. For example, the workpiece 100 may be brought near the drill 1. Similarly, in the step (iv), the workpiece 100 and the drill 1 may be relatively separated from each other. For example, the workpiece 100 may be separated from the drill 1.

When the cutting of the workpiece as described above is carried out a plurality of times, specifically, when a plurality of through holes 101 are formed in the single workpiece 100, the step of bringing the first cutting edge 11a and the second cutting edge 11b of the drill 1 into contact with different portions of the workpiece 100 may be repeated while maintaining the rotation of the drill 1.

A similar effect is obtainable by using the drill of any one of the foregoing second to sixth embodiments, instead of the drill 1 of the first embodiment.

While the several embodiments of the present invention have been described and illustrated above, the present invention is not limited to the foregoing embodiments. Needless to say, optional ones can be made insofar as they do not depart from the gist of the present invention.

For example, in a modification, the helix angle θ1 of the first flute 12a and the helix angle θ2 of the second flute 12b may be set to have the following relationship, instead of the relationship as described in the foregoing first embodiment. That is, in order away from the front end of the cutting part 10, in the third region, the helix angle θ1 and the helix angle θ2 are both in the range of 40-50° and are identical to each other; in the first region 10A, the helix angle θ1 is in the range of 20-30°, and the helix angle θ2 is in the range of 40-50°; in the second region 10B, the helix angle θ1 and the helix angle θ2 are both in the range of 40-50°. Hereat, the helix angle θ1 and the helix angle θ2 remain unchanged, namely, are constant in each of these regions. The helix angle θ1 of the first flute 12a is changed upon entering the first region 10A from the third region, and is changed upon entering the second region 10B from the first region 10A. Also in this modification, a similar operation and effect to those of the foregoing first embodiment can be achieved.

In the above modification, the helix angle θ1 of the first flute 12a may be set to gradually change upon entering the first region 10A from the third region, and upon entering the second region 10B from the first region 10A.

Although the present invention is described in more details below by illustrating examples, the present invention is not limited to the following examples. The drills A1 to C1, and A2 to C2, the printed circuit boards A and B, and the stiffening plates A and B, which were used in the following examples or comparative examples, are as follows.

(Drill A1)
Outer diameter of cutting edge: 0.12 mm
Length of cutting part: 2.2 mm
First flute and second flute: being separately extended from the front end to the rear end
Cutting part: having the following configurations (1) to (7).

(1) Including a first region where the diameter W of an inscribed circle in the cross section perpendicular to the rotation axis O increases in the direction away from the front end and toward the rear end;
(2) In the first region, the ratio R increases in the direction away from the front end and toward the rear end;
(3) Including a second region where the ratio R is constant;
(4) The first region and the second region are located continuously with each other;
(5) The ratio of the first region and second region is 1:4;
(6) In the first region, the difference between the helix angle θ1 of the first flute and the helix angle θ2 of the second flute decrease in the direction away from the front end and toward the rear end; and
(7) In the second region, the helix angle θ1 and the helix angle θ2 are identical to each other.

Figure 2:
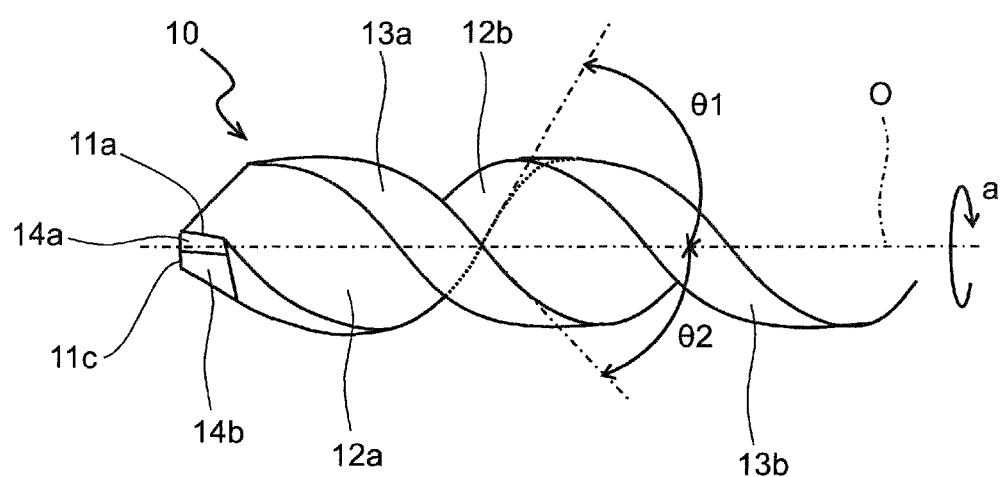
FIG. 2(a) is a partially enlarged side view showing the vicinity of a front end of the drill shown in FIG. 1(a)
FIG. 2(b) is an enlarged front view thereof.
Figure 2:
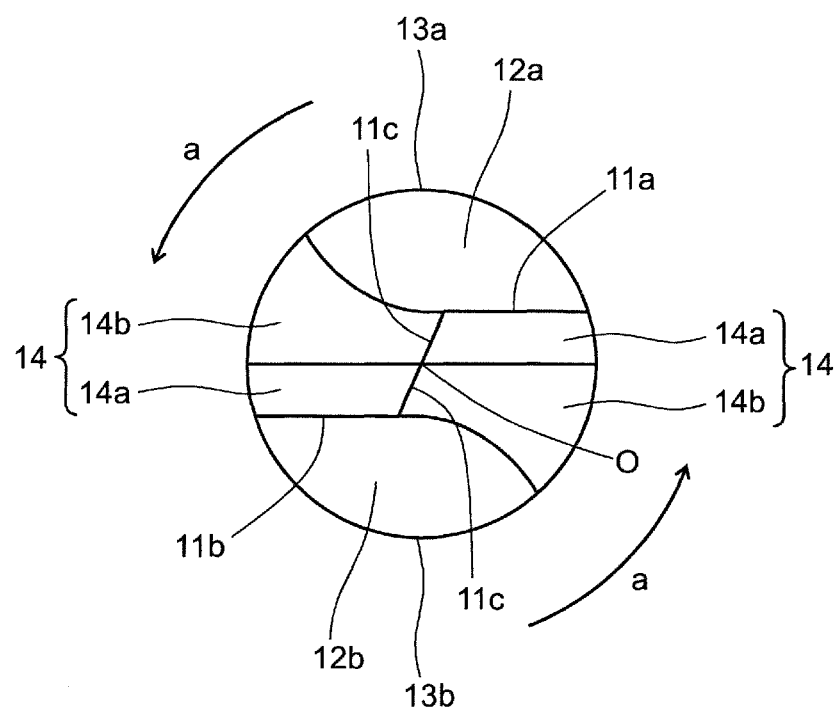

Other configurations of the aforementioned drill 1A are identical to those of the drill 1 according to the first embodiment as shown in FIGS. 1 and 2.

(Drill B1)
This drill has the same configuration as the drill A1, except that the ratio R is constant from the front end to the rear end.

(Drill C1)
This drill has the same configuration as the drill A1, except that the first flute and the second flute are joined together.

(Drill A2)
Outer diameter of cutting edge: 0.095 mm
Length of cutting part: 1.4 mm
Others: The configurations of the drill A2 other than those described above are identical to those of the drill A1.

(Drill B2)
This drill has the same configuration as the drill A2, except that the ratio R is constant from the front end to the rear end.

(Drill C2)
This drill has the same configuration as the drill A2, except that the first flute and the second flute are joined together.

(Printed Circuit Board A)
This is a board having a thickness of 0.4 mm ("679FGR" manufactured by Hitachi Chemical Company, Ltd.), in which copper foil is laminated on a glass epoxy material having glass fiber impregnated with resin, such as epoxy.

(Printed Circuit Board B)
This is a board having a thickness of 0.1 mm ("679FGB" manufactured by Hitachi Chemical Company, Ltd.), in which copper foil is laminated on a glass epoxy material having glass fiber impregnated with resin, such as epoxy.

(Stiffening Plate A)
This is a lubricant resin coated sheet "LE800" manufactured by Mitsubishi Gas Chemical Company Inc.

(Stiffening Plate B)
This is a lubricant resin coated sheet "LE900" manufactured by Mitsubishi Gas Chemical Company Inc.

Example 1, Comparative Examples 1 and 2

These three printed circuit boards A were overlappingly mounted on the table of a machine tool to which the drills A1 to C1 were attached in the combination presented in Table 1, and cutting was carried out with each drill by using the stiffening plate A. The cutting conditions were as follows.

(Cutting Conditions)
Rotation speed: 300,000 revolutions/min
Feed rate: 2.4 m/min
The cutting was carried out a total of 3,000 hits (the number of cuttings). The hole position accuracy of the drilled hole was measured every time it reached 500 hits, 1,000 hits, 1,500 hits, 2,000 hits, 2,500 hits, and 3,000 hits. Further, the inner wall roughness of the drilled hole after 3,000 hits was measured in the following manner. These results were presented together in Table 1.

(Hole Position Accuracy Measurement)

The misregistration of the obtained drilled hole was measured by using a hole position accuracy measuring device ("HA-1AM" manufactured by Hitachi Via Mechanics, Ltd.). Specifically, the drilled hole of the board A located at the lowermost side of these three mounted boards A was photographed by a CCD camera, and the misregistration from the position of the desired hole position was measured. An average value and a standard deviation σ for each of the predetermined numbers of hits were calculated, and the value of the average value plus 3σ was obtained as a hole position accuracy value. A smaller value thereof showed superior hole position accuracy.

(Inner Wall Roughness Measurement)

Figure 9:
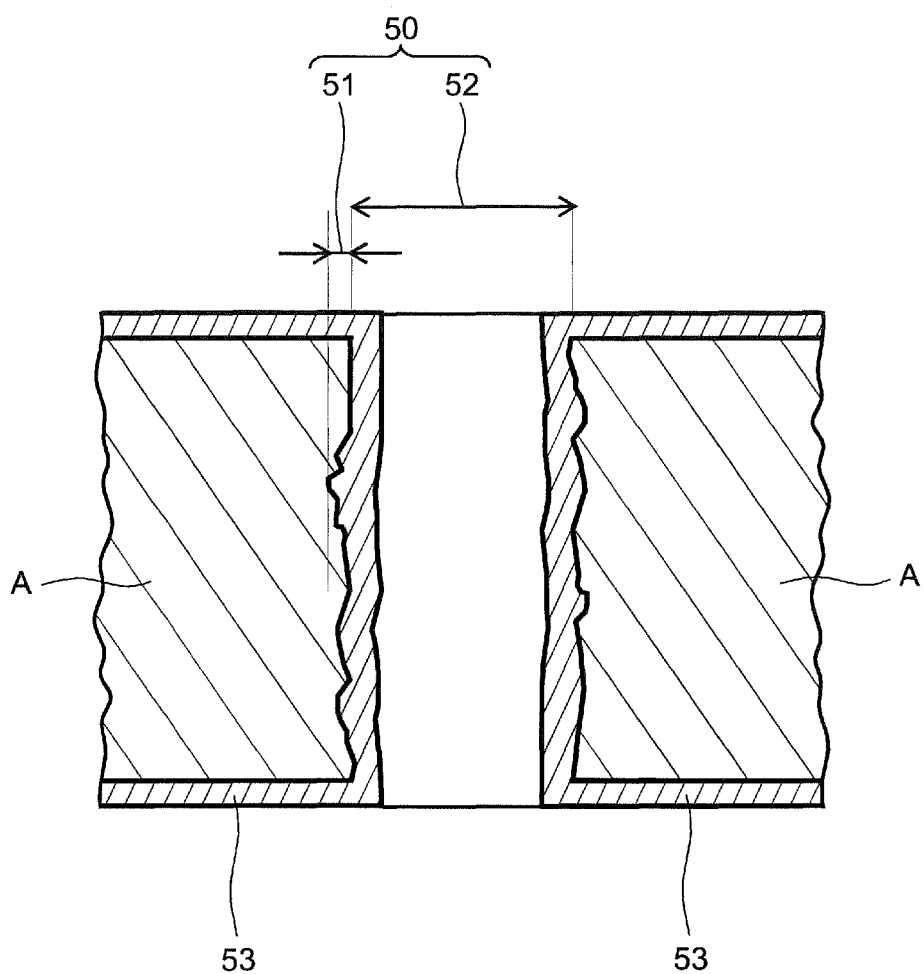
FIG. 9 is a schematic sectional explanatory drawing showing a drilled hole for measuring inner wall roughness in examples.

This was carried out by using cross section method. That is, as shown in FIG. 9, the drilled hole 50 formed in the lowermost board A had an inner wall roughness 51 and a drilled hole diameter 52. Firstly, the drilled hole 50 was subjected to through-hole plating 53, followed by resin filling. In the resin filling, acrylic resin (more specifically, "Citrix cold filled resin" manufactured by Struers Limited) was used. Subsequently, a sample for observation was manufactured by polishing the drilled hole diameter 52 so that the cross section of the drilled hole 50 can be observed. The roughness (inner wall roughness) of the drilled machined surface of the sample for observation was measured by a microscope (magnification: 200 times). The inner wall roughness was measured five times (five holes) for each of the three boards, and the average value thereof was calculated. A smaller value thereof showed superior inner wall roughness.

TABLE 1

|  | Drill | Hole Position Accuracy Value[1] (μm) | | | | | | Inner Wall Roughness (μm) | | |
|---|---|---|---|---|---|---|---|---|---|---|
|  |  | 500 Hits | 1,000 Hits | 1,500 Hits | 2,000 Hits | 2,500 Hits | 3,000 Hits | Average Value | Maximum Value | Minimum Value |
| Example 1 | A1 | 10.9 | 12.3 | 13.9 | 14.6 | 14.7 | 15.1 | 3.3 | 4.5 | 2.7 |
| Comparative Examples 1 | B1 | 14.5 | 15.8 | 17.2 | 18.1 | 19.7 | 21.5 | 3.4 | 4.7 | 2.4 |
| Comparative Examples 2 | C1 | 11.5 | 12.1 | 13.3 | 14.2 | 15.5 | 16.3 | 11.3 | 14.3 | 9.1 |

[1]indicates the value of the average value plus 3σ.

As apparent from Table 1, in Example 1 using the drill A1 in which the diameter W of the inscribed circle and the ratio R increased in the direction away from the front end and toward the rear end, and the individual flutes were not joined together, the hole position accuracy value and the inner wall roughness were both small, thus showing that high-quality drilled holes were obtained in the low heat resistant workpiece. In contrast, Comparative Example 1 using the conventional two-blade drill B1 whose ratio R was constant showed poor position accuracy. On the other hand, Comparative Example 2 using the drill C1 in which the individual flutes were joined together showed poor inner wall roughness.

Example 2, Comparative Examples 3 and 4

A predetermined number of the printed circuit boards B were overlappingly mounted on the table of the machine tool to which the drills A2 to C2 were attached in the combination presented in Table 2, and cutting was carried out with each drill by using the stiffening plate B. The overlapping numbers of the printed circuit boards B were three, five, and six. The cutting conditions were as follows.

(Cutting Conditions)
Rotation speed: 300,000 revolutions/min
Feed rate: 1.5 m/min The cutting was carried out a total of 10,000 hits. The fracture resistance of each drill was evaluated as follows. The results thereof were presented in Table 2.

(Fracture Resistance)

The evaluation was made as to whether the drill fractured by 10,000 hits. The evaluation criteria were set as follows.

Symbol "○": The drill did not fracture by 10,000 hits.
Symbol "x": The drill fractured by less than 10,000 hits.

The number of hits when the drill fractured was presented in Table 2.

TABLE 2

|  | Drill | Fracture Resistance | | |
|---|---|---|---|---|
|  |  | Three[1] | Five[1] | Six[1] |
| Example 2 | A2 | ○ | ○ | ○ |
| Comparative Examples 3 | B2 | ○ | x (2,800 Hits) | x (1,000 Hits) |
| Comparative Examples 4 | C2 | ○ | x (2,300 Hits) | x (700 Hits) |

[1]indicates the overlapping numbers of the printed circuit boards B.

As apparent from Table 2, Example 2 using the drill A2, in which the diameter W of the inscribed circle and the ratio R increased in the direction away from the front end and toward the rear end, and the individual flutes were not joined together, had excellent fracture resistance irrespective of the overlapping number of the printed circuit boards B, thus showing sufficient rigidity. In contrast, both Comparative Example 3 using the conventional two-blade drill B2 whose ratio R was constant, and Comparative Example 4 using the drill C2 in which the individual flutes were joined together, showed poor results in terms of the fracture resistance when the overlapping numbers of the printed circuit boards B were five and six.

From the foregoing two kinds of examples, it was found that the drills of the embodiments of the present invention had both high-quality hole drilling characteristics and sufficient rigidity.

The invention claimed is:

1. A drill, comprising:
    a first cutting edge and a second cutting edge each located at a front end of a cylindrical cutting part;
    a first flute and a second flute connected to the first cutting edge and the second cutting edge, respectively, the first and second flutes being positioned helically from the front end to a rear end on a peripheral section of the cutting part; and a first land and a second land each extended from the front end to the rear end on the peripheral section of the cutting part, the first and second lands being located between the first flute and the second flute, respectively, wherein the first flute and the second flute are separately extended from the front end to the rear end, the cutting part comprises a first region in which a diameter of an inscribed circle in a cross section perpendicular to a rotation axis of the cutting part increases in a direction away from the front end and toward the rear end, an angle difference between the helix angle $\theta 1$ of the first flute and a helix angle $\theta 2$ of the second flute increases toward the rear end in a front end portion of the first region, and the angle difference between the helix angle $\theta 1$ and helix angle $\theta 2$ decreases toward the rear end in a rear end portion of the first region which is extended from the front end portion to the rear end.

2. The drill according to claim 1, wherein a radius of a shaft core portion of the cutting part increases in the direction away from the front end and toward the rear end.

3. The drill according to claim 1, wherein the first flute and the second flute have the same shape in the front end portion and a depth of the second flute is smaller than a depth of the first flute in a rear end portion.

4. The drill according to claim 1, wherein, in the cutting part, D1 and D2 has a relationship of D1≥D2, where, in the cross section perpendicular to the rotation axis, D1 is a diameter at the front end, and D2 is a diameter at a portion other than the front end.

5. The drill according to claim 1, wherein, in the cross section perpendicular to the rotation axis, the cutting part has a diameter that is constant from the front end to the rear end.

6. The drill according to claim 1, wherein, a ratio R (L1/L2) of a length L1 of the first land and a length L2 of the second land in the cross section perpendicular to the rotation axis increases in the direction away from the front end and toward the rear end.

7. The drill according to claim 6, wherein the cutting part further comprises a second region in which the ratio R is constant.

8. The drill according to claim 7, wherein, in an end portion of the second region closer to the front end, the ratio R is 1.5 or more.

9. The drill according to claim 7, wherein the first region and the second region are located continuously with each other.

10. The drill according to claim 6, wherein, in the first region, the length L1 of the first land increases in the direction away from the front end and toward the rear end, and the length L2 of the second land decreases in the direction away from the front end and toward the rear end.

11. The drill according to claim 1, wherein, in the first region, a maximum angle of the difference between the helix angle $\theta 1$ and the helix angle $\theta 2$ is 1° or more.

12. The drill according to claim 1, wherein the cutting part further comprises a second region which is located closer to the rear end than the first region and is continuous with the first region, and the helix angle $\theta 1$ and the helix angle $\theta 2$ are identical with each other in the second region.

13. The drill according to claim 12, wherein the helix angle $\theta 1$ and the helix angle $\theta 2$ are each 30-60° in the second region.

14. A method of cutting a workpiece, comprising:

preparing a workpiece;

rotating the drill according to claim 1;

bringing the first cutting edge and the second cutting edge of the rotating drill into contact with the workpiece so as to form a through hole in the workpiece; and separating the workpiece and the drill from each other.

15. The method of cutting a workpiece according to claim 14, wherein the step of preparing the workpiece comprises:

laminating a plurality of boards with a conductor formed on their respective surfaces while interposing between the boards an intermediate layer containing a resin material; and heating the intermediate layer so as to soft the resin material.

16. The method of cutting a workpiece according to claim 14, wherein, in the step of forming the through hole, a partial region closer to the rear end in the cutting part of the drill is not passed through the workpiece.

17. The method of cutting a workpiece according to claim 14, wherein the workpiece is a printed circuit board.

18. The method of cutting a workpiece according to claim 14, wherein the workpiece contains glass.

* * * * *